United States Patent [19]
Flaherty et al.

[11] Patent Number: 5,414,343
[45] Date of Patent: May 9, 1995

[54] PERMANENTLY INSTALLED CABLE SYSTEM WITH INTEGRATED MULTI-CABLE TESTER

[75] Inventors: Samuel J. Flaherty, 605 Oak St., Telford, Pa. 18969; James P. Ashbaugh, Harleysville, Pa.

[73] Assignee: Samuel J. Flaherty, Telford, Pa.

[21] Appl. No.: 922,025

[22] Filed: Jul. 28, 1992

[51] Int. Cl.[6] ............................................. G01R 31/02
[52] U.S. Cl. ......................................... 324/66; 324/539
[58] Field of Search ................... 324/66, 67, 538, 539, 324/540; 379/6, 14, 25, 26

[56] References Cited

U.S. PATENT DOCUMENTS

| | | | |
|---|---|---|---|
| 3,800,215 | 3/1974 | Souillard | 324/52 |
| 3,944,914 | 3/1976 | Simmonds | 324/51 |
| 3,986,106 | 10/1976 | Shuck et al. | 324/66 |
| 4,551,671 | 11/1985 | Annunziata et al. | 324/539 |
| 4,835,479 | 5/1989 | Haines | 324/540 |
| 4,837,488 | 6/1989 | Donahue | 324/539 |
| 4,901,004 | 2/1990 | King | 324/66 |
| 4,943,993 | 7/1990 | Fore | 379/6 |
| 5,027,057 | 6/1991 | Mageland et al. | 324/115 |
| 5,027,074 | 6/1991 | Haferstat | 324/539 |

OTHER PUBLICATIONS

ADC Telecommunications, Patch Switch Assemblies, 1987, USA.

Primary Examiner—Walter E. Snow
Attorney, Agent, or Firm—Eckert Seamans Cherin & Mellott

[57] ABSTRACT

A micro-processor controlled apparatus for testing a network cabling. The apparatus is permanently installed at the network cabling site. The micro-processor controls a driver which sequentially provides a voltage carrying current to the individual conductors of each cable in the network. In this manner each conductor of each cable is tested. Hard-wiring and a shorting bar which disengages upon installation of a terminal apparatus provide the voltage carrying current with at least one current path at a remote network port. The voltage carrying current is returned from the remote network port on at least one conductor coupled to a receiver. The receiver samples a plurality of conductors, preferably for evidence of the voltage. In this manner, the receiver samples for the parallel return of a digital word. If the returned digital word agrees with an expected digital word stored in the memory of the microprocessor, an indicating device will signal proper wiring of the tested cable. If the returned digital word does not agree with an expected digital word, the indicating device will signal improper wiring of the tested cable.

20 Claims, 3 Drawing Sheets

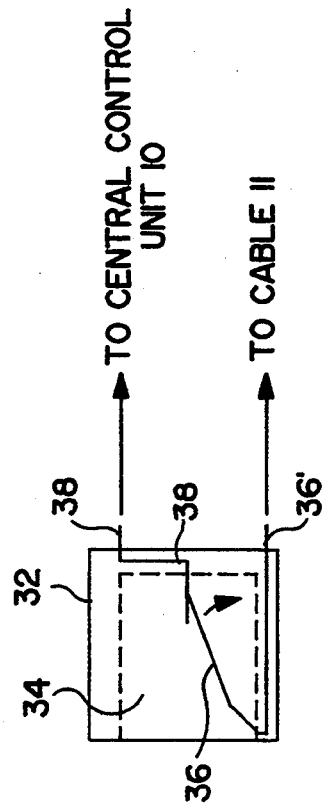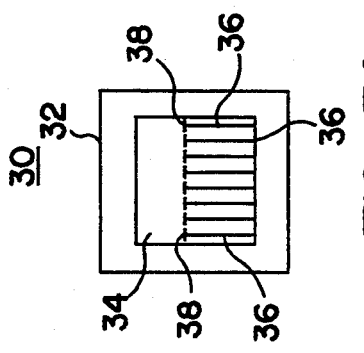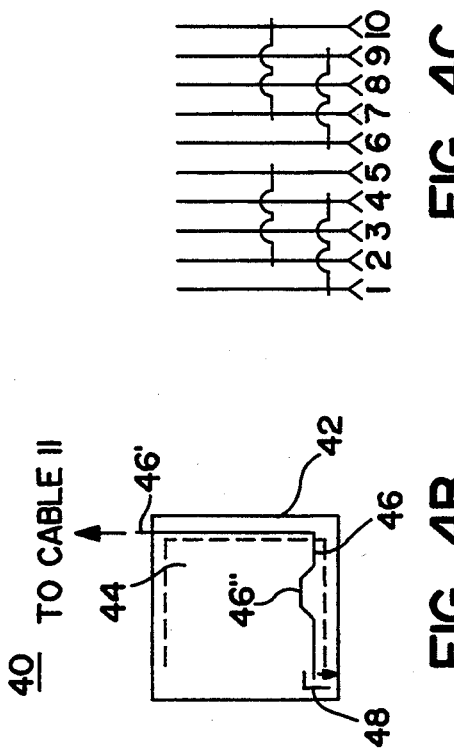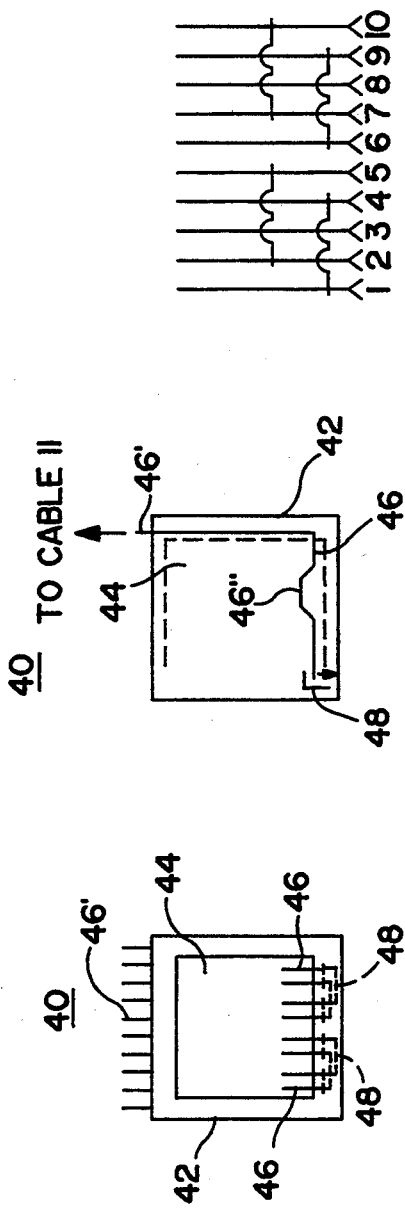

PERMANENTLY INSTALLED CABLE SYSTEM WITH INTEGRATED MULTI-CABLE TESTER

BACKGROUND OF THE INVENTION

1. Field of the Invention

This invention relates to the field of electrical test apparatus and more particularly to a testing apparatus operable to check for short and open circuit conditions in a multiconductor cabling system, installed permanently at the cabling site and capable of testing an entire cabling network as well as a selected cable termination.

2. Prior Art

Computer and telecommunications networks having a central main unit and a plurality of remote units or terminals coupled to the main unit are known in many variations. An example in the computer field is a local area network having one or more central file servers coupled to a plurality of user terminals in a business or office. Another example is a PBX telephone system in which a central switching apparatus is coupled to a plurality of distributed telephone sets.

The main unit is typically located in a closet or computer room, out of the way of the office staff. Wherever it may be located, the main unit is cabled to a number of remote ports, located for example at each desk or office and at other locations where access to the network might be beneficial. In many installations a series of multiconductor cables, each being terminated at a plug or jack, extend through walls, cable ducts and the like from the central unit to the area of the user. Often the plugs are mounted in wall outlets, for example using RJ11 or RJ45 receptacles. A "drop" cable is then used to make the connection between the wall outlet and the computer or other device which is to communicate over the network. For convenience and to accommodate future needs, a large number of wall outlets and cables may be installed in a business, such that a convenient outlet is likely to be available for use, nearby a desk or the like.

In the example of a computer local area network, remote terminals having a video display and limited processing and storage functions can be coupled to the ports as need warrants. The users then can communicate, share devices and otherwise enjoy the additional processing power and storage of the server.

A fault may occur in a device coupled to the network or in the cabling which runs between the central and remote devices. It is easy to misdiagnose a device problem as a connection problem and vice-versa, because often the result is the same: failure to receive accurately at a remote device the information ostensibly transmitted from another device. For example, it is difficult to determine whether a fault in transmission resides in the sender, the receiver, the interface circuits or the terminating plugs/receptacles and cabling between them. Faulty cabling which disrupts network performance is particularly troublesome since the location of the cabling error such as a short or open circuit may occur anywhere, but the symptoms could be observable everywhere.

It is practically a necessity that all network cabling be checked or "rung out" prior to going on-line with the system. Additionally, service technicians generally carry continuity testing apparatus that can be used to identify short and open circuit conditions. Testers are also available to measure resistance, capacitance, inductance, voltage and current. Typically however, cabling testers require two people (one person at each end of a cable) and rely on means for the two to communicate. For single person use, the testers normally require the technician to move back and forth between points at which the cable conductors can be accessed. For example, a simple portable continuity tester may require the user to detach the cable at both ends, check for shorts by measuring continuity between all the conductors in pairs, then short conductors at one end of a cable and measure continuity between the conductors at the opposite end.

Separate components adapted to facilitate this operation can be coupled to the opposite ends of a cable, using the same form of connector as the device which normally uses the port. One component is a shorting plug or diode arrangement; the other component generates a signal on certain of the conductors and checks for the signal to appear on others of the conductors. Provided the cable connections are correct along the cable path, which may include intermediate connections, and are not shorted, signals generated and sent through the cable and returned and read on the conductors where they are expected to appear only. The diode arrangement allows for signals at different polarities to identify shorts and opens on particular conductors to which current is routed or not routed as a function of the voltage bias across the respective diodes.

Another form of known tester is a listening device which is coupled serially with the cable and which senses data transmitted along the cable, either from a terminal or from a test apparatus plugged into a wall port in place of the terminal.

Other cable testing devices are disclosed in a number of U.S. patents, for example Simmonds U.S. Pat. No. 3,944,914. Simmonds discloses apparatus for detecting faults in multiconductor cable having paired conductors. The apparatus described in Simmonds is portable and can be coupled temporarily to the terminus of a port. A switch in the device selects which pair of conductors in the multiconductor cable will be tested. The device charges the conductors and measures capacitance, and the measured capacitance is compared to known or expected values. Measured values departing from nominal values indicate a fault in the cable.

Donahue U.S. Pat. No. 4,837,488 discloses another portable cable tester. Donahue uses a first unit including a power supply for mating with an end of a cable and a second unit for mating with an opposite end of the cable. Jumpers provide paths for current to ensure that the test signal is routed through all four (4) wires of a network cable.

Fore U.S. Pat. No. 4,943,993 discloses a cable pair tester that initially relies on a lack of electrical continuity between cable pairs. Upon command from the cable tester, electrical continuity is established between selected ones of the cable pairs and a test signal is applied to verify the continuity of the conductors.

Haferstat U.S. Pat. No. 5,027,074 discloses a portable multiconductor cable tester including a transmitter for connection to one end of a cable and a receiver for connection to an opposite end of the cable. The transmitter sends data in the form of voltage pulses, which are intended for receipt by the receiver, where the data is checked against expected values. The receiver monitors the pulses and feeds the data to an on-board microprocessor for processing, and display of the results on an LCD display.

It would be advantageous to provide a cable testing device which is automated but does not require special steps for coupling portable devices to each end of the cables to be tested. According to the present invention, such a cable tester is achieved in that means are permanently installed in the wall outlets or the like, which can be used later as cable terminations when the cable is to be tested. Such an arrangement would appear to have two major drawbacks, namely the cost of the permanently installed termination circuitry, and the fact that termination circuits would presumably interfere with the basic use of the cable for data transmission, or at least would detract from the performance characteristics of the port. However, according to the invention a mechanically operated electrical interlock disengages the termination circuits from the cable when a connector is plugged in, and engages the termination circuits otherwise. The termination circuits are inexpensive enough for permanent installation and do not interfere with use of the cable. A central testing means enables an investigation of the termination circuits in an automated manner, providing an on-site apparatus for testing of an entire cabling network or a single addressed cable from a central location.

SUMMARY OF THE INVENTION

It is a general object of this invention to provide a cable testing apparatus for checking for short and open circuit conditions in multiconductor cables.

It is a further object of this invention to provide cable testing apparatus for multiconductor cable networks, which is installed permanently at the cabling site and is capable of testing an entire cabling network.

It is an additional object of this invention to provide an on-site cable testing apparatus which is essentially located and controlled from a central location.

It is another object of the invention to enable automated testing of a cable network using permanently installed termination circuits at remote points on the cable, which can be queried by a central cable testing apparatus to check for conductor continuity and shorting when needed, but which are electrically decoupled from the cable when the cable is in use for its basic purpose.

These and other objects are accomplished by an on-site system cabling test apparatus for testing a network of multiconductor cables. The test apparatus has a microprocessor controlled central control unit for placing a pattern of voltages on the conductors of each cable in the network, and means for sensing shorts coupling the conductors of the cable, or open circuits along particular conductors, by reading the voltage levels which result. The central control unit is switchably coupleable to the proximal end of selected network cables, enabling the cables to be addressably queried. The remote end of the network cables are preferably coupled to connectors or ports having contacts for mating normally with a respective connector of a terminal apparatus, for example a desk-top terminal, printer, telephone set, etc. The remote connectors typically have more contacts than are necessary to be coupled to individual lines in a cable. The superfluous contacts are hard-wired one to another or one to others for establishing current paths among them. Diodes and resisters are included in the hard-wiring to pass or block current depending on its direction.

A shorting bar also electrically couples contacts at a port thereby providing additional current paths. The shorting bar electrically disengages from the contacts when a terminal apparatus is installed. Accordingly, the shorting bar, when engaged, provides current paths to both superfluous and normally active contacts.

Upon initiation of testing a given cable, the microprocessor generates a voltage on certain conductors of the cable via switching circuits. Preferably, the microprocessor controls one or more shift registers which sequentially provide the voltage to one of a plurality of conductors, the active output being shifted through the outputs of the register to test the effect of the voltage between conductors.

The voltage applied to the conductors, in turn, branches among a number of paths established by the shorting bar, the hard wiring and the diodes coupled to the superfluous wiring. The microprocessor controller reads the voltages on the respective conductors which are generated due to the test voltage pattern and the connections defined in the termination circuit, and compares the data word thus provided to an expected data word stored in memory.

In the example of a cable and jack arrangement having four used conductors out of eight provided, each wire of the tested cable is coupled to a test voltage individually, and a four bit digital word is read from the conductors and compared by the controller with expected values. The four bit digital word represents the initial or drive voltage applied to the conductor, branched and returned along at least one of the lines of the cabling, such that a plurality or all of the conductors are interrogated. For example, a voltage applied to conductor "a" of a cable having four lines designated a,b,c and d, might be coupled through the diodes and shorting bar to be returned on line c only, due to the connections and diode polarity. Accordingly, the central control unit expects to find the returned voltage on line a (where it was generated) and line c (to which the voltage was coupled by the termination circuit).

If the returned digital word agrees with what is expected by the central control unit, the test proceeds to the next conductor. A green LED or other indicator can be illuminated, signifying that the test has found no fault with the cable or with an individual line; or if the word does not agree, a red LED can be lit. Each cable or each line of every cable can have a dedicated set of LED's, one red, one green, or other display formats can be used, under control of the microprocessor.

Preferably, each of the conductors of the cable are interrogated for return of a correct digital word, although it is also possible to check fewer than all. The branching due to diode and jumper couplings in the termination circuits can be arranged such that the correctness of the wiring of any conductors which are not subjected to a driving voltage, is made apparent when the driving voltage is applied to one of the other conductors. Similarly, as the voltage is applied to other conductors as the test progresses, the branching can be arranged for redundancy (e.g., testing at opposite polarities) for most or all of the conductors.

In the preferred embodiment, the returned digital word is coupled to the parallel data inputs of a shift register and clocked through to a microprocessor or to additional shift registers as a serial data stream. There are a number of alternatives for storing and displaying the test results.

When a terminal device is connected to a remote port connector, the termination circuits are decoupled from the conductors by operation of the shorting bar. More particularly, by plugging a terminal device into the remote end of the port the shorting bars are mechanically moved clear of the active conductors. Should the test apparatus be operated in this mode, the red LED (or other indicator) for any conductor on the connector coupled to a contact of the terminal device illuminates. In this manner, the test apparatus is also usable to check and indicate which of the remote ports are coupled to terminal devices, and which are available. When the system cabling is coupled to the main network unit, the test apparatus is disabled and all LED's or other indicators are extinguished.

Additional aspects and variations on the invention will be apparent in view of the following discussion of certain exemplary embodiments.

BRIEF DESCRIPTION OF THE DRAWINGS

There are shown in the drawings the embodiments of the invention as presently preferred. It should be understood that the invention is not limited to the preferred examples, and is capable of variations within the scope of the appended claims defining the invention.

FIG. 3A is a front view of a connector used at the central control unit.

FIG. 3B is a side cut-away view of the connector of FIG. 3A.

FIG. 4A is a front view of a connector used at a terminal port.

FIG. 4B is a side cut-away view of the connector of FIG. 4A.

FIG. 4C is a schematic view of the shorting bars of the connector of FIG. 4A.

DETAILED DESCRIPTION OF THE PREFERRED EMBODIMENTS

The invention concerns a permanently installed test apparatus for finding and indicating cabling problems in a multiconductor cabling network such as a local area computer network, telephone PBX network or other system having a central unit coupled to remote terminals by cabling. The cabling problems may be open circuits along the cable conductors, shorts between cable conductors, or conductors which are shorted to a ground. At least one port couples a terminal device to the central unit in the normal operating mode. The port typically terminates at a connector such as a wall outlet or the like, with a receptacle having a plurality of contacts. RJ11, RJ45 or other connectors may be used for coupling the central unit to the terminal device.

The test apparatus of the invention has a voltage source for providing a test voltage, and means for applying the voltage to selected conductors on the cable to be tested, preferably to a plurality of cables, either simultaneously or in turn. The test voltage is applied so as to define a digital word having a plurality of bits coupled to respective conductors in the cable, which may be termed the drive data word. The drive word queries the cable, and while the drive word is applied, means coupled to the conductors for reading a digital word record the voltage coupled to the conductors through the cable and its termination.

This arrangement may involve positive or negative voltages, a series of different voltage levels or combinations of the above. For simplicity, the invention is described with reference to an example having only two voltage levels for defining the drive data word, namely a positive DC voltage or ground. The positive voltage will be termed a digital "1" and the ground voltage a digital "0". It will be appreciated that this description is for purposes of convenient explanation and is not intended as limiting.

Assuming the higher voltage bits of the drive word are set, the data returned in the read data word normally has bits set for any bits which are set in the drive data word as well as additional bits which are coupled through the termination circuits. In the event of a short between conductors, unexpected bits are set. In the event of an open circuit, expected bits are not set. In the event of a grounded conductor, the drive bits are not set. The drive data word is generated, and the read data word is discerned, by an interrogation means operable to compare the returned read data word to a word which is expected due to the nature of the termination circuits, i.e., due to the connections made or blocked by the jumpers and diodes. The interrogation means is coupled to means for indicating whether or not the return digital word agrees with the expected word.

Figure 1:
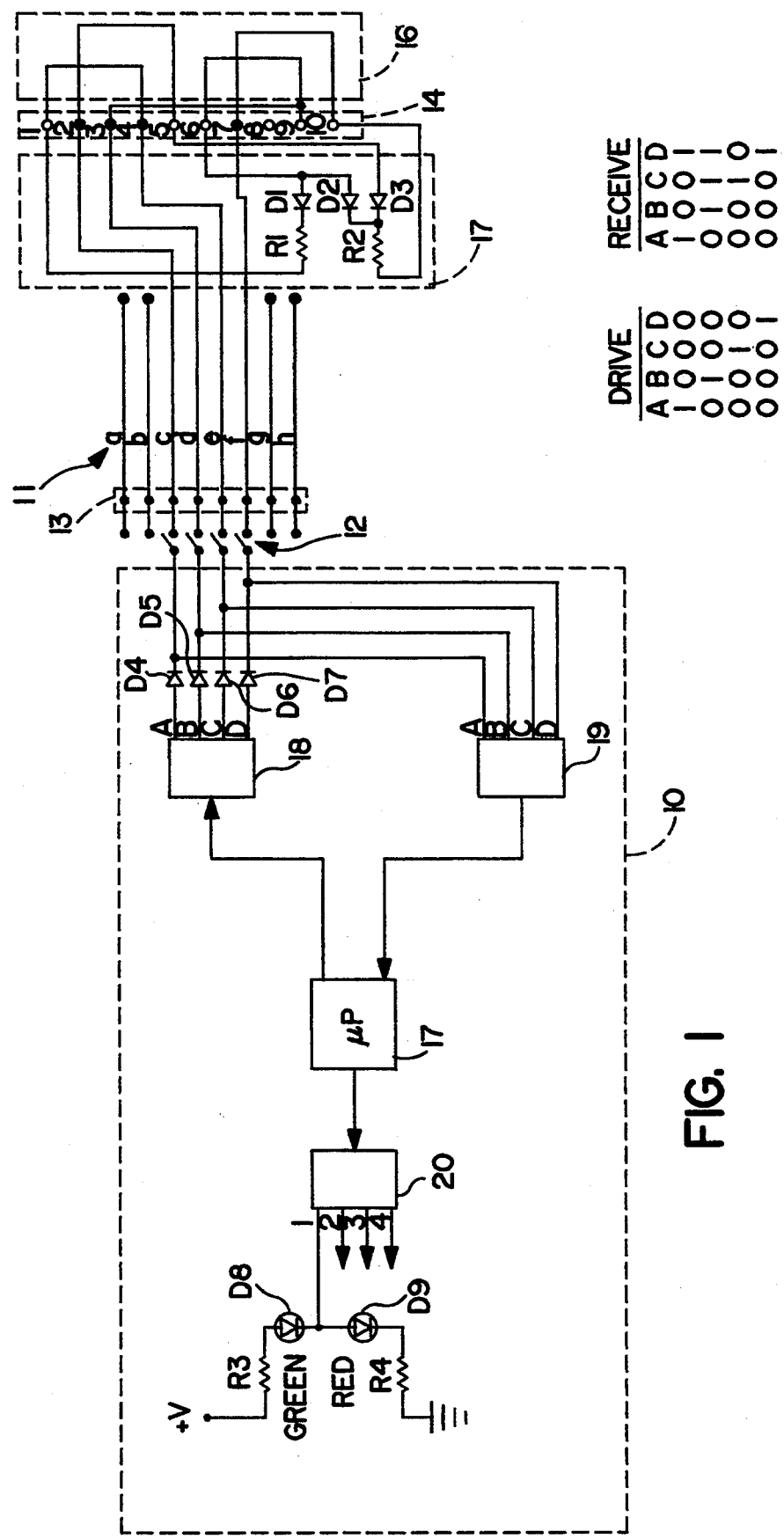
FIG. 1 is a schematic diagram showing the test apparatus of the invention coupled to a connector defining a terminal port.
Figure 2:
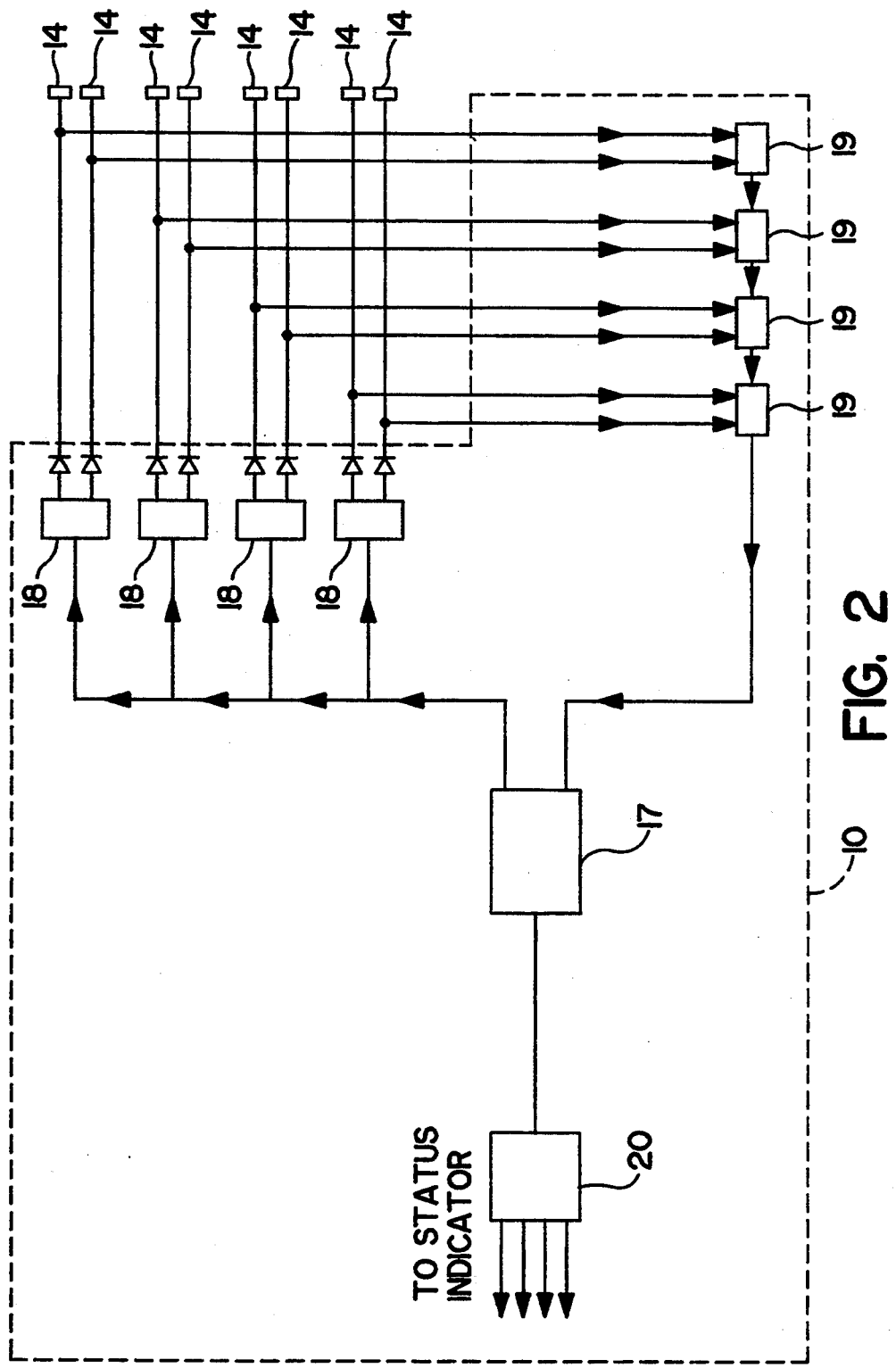
FIG. 2 is a schematic block diagram showing a plurality of cable terminations subject to test.

Referring to FIGS. 1 and 2, the test apparatus includes a central control unit 10 including microprocessor 17, which is conveniently installed near the central main operational unit of the network hub, concentrator, controller, PBX or CPU, where the proximal ends of the cables come together. The system cabling, which otherwise would couple directly to the main unit (e.g., a file server), can be coupled to the main unit through the central control unit 10. The central control unit 10 can connect to the cabling automatically when the cabling is disengaged from the server or main processing unit. The central control unit also can have switch means which alternatively connect the conductors of each cable bundle 11 to either the control unit 10 or the main operational unit.

In the embodiment shown, when the cabling is coupled to the main operational unit or server, the central control unit disengages from cable 11. This is represented in FIG. 1 by switches 12.

In the preferred embodiment, the connector of FIG. 3A and 3B is used. FIG. 3A is a front view of the connector 30. Connector 30 is preferably an ADC RJ2000-180. As shown in FIG. 3A, connector 30 has connector body 32. Connector body 32 has socket 34 for insertion of a plug carrying signal lines from the main operational unit or server. Within socket 34 are resilient contacts 36. In FIG. 3A, eight (8) resilient contacts 36 are shown, however, more or less can be used depending on the need of the system, or, more than one connector 30 may be used. Resilient contacts 36 have a leaf spring action that biases an end of the resilient contacts 36 against an end of pins 38. Pins 38 extends through connector body 32 for coupling to central control unit 10. Fixed ends 36' of resilient contact 36 extends through connector body 32 for coupling to, for example, cable 11. As shown in FIGS. 3A and 3B, an electrical path is established between central control unit 10 and cable 11 when no plug from a main operational unit or server is inserted in recess 34 of connector 30. When a plug from operational unit or server is inserted in recess 34 of connector 30, resilient contacts 36 are forced downward out of contact with pins 38. The circuit between cable 11 and central control unit 10 thereby opens. A circuit is established between the main operational unit or server and cable 11 by interface of the plug of the main operational unit or server with resilient contacts 36. Upon removal of the plug, electrical continuity is reestablished between cable 11 and central control unit 10 as resilient contacts 36 spring upwards against pins 38.

The conductors of cable 11 preferably are coupled to patch panel 13, providing easy access to each of the conductors as well as a means to vary the connections between particular cables and particular inputs to the main operational unit, for example for troubleshooting purposes.

As shown in FIG. 1, cable bundle 11 consists of 8 separate conductors, a through h. Many terminal devices installed on networks require only four active conductors, for example for the send pair and receive pair of a full duplex TTY current loop connection. Therefore, as shown if FIG. 1, only lines c, d, e and f are coupled actively to pins on port 14. For example, line c is coupled to pin 2 of port 14; line d to pin 3; line e to pin 4; and line f to pin 7.

A disengageable shorting bar 16 is provided for providing current paths between certain pins of port 14. For example, shorting bar 16 couples pins 1 and 4; 2 and 5; 3, 6 and 9; and 7 and 10. The shorting bar is constructed such that upon installation of a terminal apparatus such as by insertion of the plug of a drop cable leading to a terminal device, into the receptacle of port 14, shorting bar 16 disengages from port 14. In one embodiment, the shorting bar is resiliently biased mechanically by a spring of the like to rest against the conductors in the receptacle, normally mounted in a wall plate. Insertion of the plug simply retracts shorting bar 16 against the resilient bias.

In the preferred embodiment, the plug socket 40 of FIGS. 4A–4C is used. FIGS. 4A–4C depict a ten (10) contact plug socket 40 made by Virginia Plastics Co. and identified as MODCOM-C ®.

As shown in FIG. 4A, plug socket 40 has plug body 42. Within recess 44 of plug socket 40 reside ten (10) resilient contacts 46. Resilient contacts have fixed end 46' protruding through the plug body 42.

When no terminal device is connected to plug socket 40, i.e. by insertion of a plug into plug socket 40, resilient contacts 46 are electrically coupled to an end of shorting bar 48. Shorting bar 48 is enclosed with plug body 42. An opposite end of shorting bar 48 is similarly situated under another of the resilient contacts 46 of plug socket 40. As shown in FIGS. 4A and 4C, a shorting bar 48 electrical couples the first and fourth, second and fifth, sixth and ninth, and seventh and tenth resilient contacts 46 when no plug is inserted in plug socket 44. As note above, the preferred embodiment of the invention requires that the third, sixth and ninth pins of port 14 be coupled together. This can be easily accomplished using the device shown in FIGS. 4A–4C by simply attaching a jumper at fixed end 46' between either of the third and sixth or third and ninth resilient contacts 46.

Upon insertion of a plug from a terminal device into recess 44 of plug body 42, bowed portion 46'' of resilient contacts 46 interfaces with the plug of the terminal device thereby forcing resilient contact 46 downward. When resilient contact 46 is forced downward, the electrical coupling between resilient contact 46 and shorting bar 48 opens. The terminal device is thus engaged to the cable 11 and a main operational unit or server without interference from the shorting bars 48.

In addition to connections provided by the shorting bar, current paths are provided between the pins of port 14 by branching circuit 17. Branching circuit 17 includes diodes D1, D2 and D3 and resistors R1 and R2. Since branching circuit 17 is coupled to pins of port 14 which are not used by the terminal device, it is not necessary to make branching circuit 17 disengage from the pins of port 14 when a terminal device is plugged in. Branching circuit 17 is thus "hard-wired" to port 14, but is only coupled into the circuit when a terminal device is not plugged in.

Upon initiation of a test sequence, microprocessor 17 loads a predetermined data pattern into shift register 18. This pattern appears as a voltage level on the respective outputs, producing a current on any one of lines a through d which is set to a binary one. For example, assume output A of driver 18 is set, i.e. has a positive voltage level. Outputs B, C, and D remain low, substantially at ground. Current from output A is passed by diode D4, and the positive voltage is coupled to parallel input A of receiver 19. Receiver 19 is preferably also a shift register having a plurality of parallel inputs. The voltage on output A of driver 18 is coupled through line c of cable 11, which is hard-wired to pin 2 of port 14. Pin 2 is coupled to pin 5 by shorting bar 16. Accordingly the voltage on output A of driver 18 is coupled to the anode of diode D3. Whereas diode D3 is forward biased, current flows through resister R2 to pin 10 of port 14 by the branching circuit 17, which is jumpered to pin 7 by shorting bar 16, thereby coupling the voltage to line f of cable 11.

Line f is coupled to the cathode of diode D7 and parallel input D of receiver 19, provided no terminal device is plugged in to disengage the jumping bar. As can be seen from the above description, when output A of driver 18 goes high, lines A and D of receiver 19 go high. Lines B and C of receiver 19 remain low. The four bit digital word, 1001 is thereby coupled as an input to receiver 19 on parallel inputs A–D. The bits on lines A–D of receiver 19 are parallel loaded and serially shifted into microprocessor 17, which is programmed to check for agreement with the expected word, 1001. The expected word is stored in the internal memory of microprocessor 17.

Microprocessor 17 controls LED driver 20. Microprocessor 17 clocks a stream of data bits into LED driver 20 for controlling the pair of LED's associated with cable 11. For example, circuits consisting of resistors R3 and R4 and light emitting diodes D8 and D9 show status for a test of cable 11. If the proper digital word is received back after a test on each conductor, i.e. after A through D are driven high, microprocessor 17 sets output 1 of LED driver 20 low, thereby illuminating green diode 8. If the received words differ from the expected words, microprocessor 17 causes output 1 of LED driver 20 to go high, whereby diode D9 is illuminated. LED driver 20 is preferably a shift register.

In the embodiment shown, the driver 18, receiver 19 and LED driver 20 are all shift registers. Driver 18 and receiver 19 are shown as parallel-load devices, with receiver 19 also being clockable by the microprocessor for serial shifting, namely to input the data read from the lines. The LED driver is arranged to be loaded serially, and has parallel outputs. It will be appreciated that parallel or serial loading and shifting can be used for the shift registers, or the registers can be coupled to a bus for time division multiplex operation whereby individual shift register elements are addressed via appropriate gating for parallel loading and reading over the bus.

Checking each of the conductors in a cable network is possible as described above, and will identify opens, shorts and grounded conductors. The system is thus operable as needed for testing the cabling interfacing remote port of a network to the network and all the connectors between the control unit and the receptacles to which the terminal devices are coupled. The invention is illustrated as to testing one cable; however, as shown in FIG. 2, a large number of cables can be tested simultaneously or sequentially, in the same manner. Driver 18 can be a long shift register having a number of parallel data outputs, and/or a plurality of drivers can be used, the outputs of which are coupled to the respective cable conductors. Furthermore, receiver 19 can have greater than four parallel data inputs and/or additional receivers can be used for accepting parallel data from additional cables. Furthermore, an LED driver 20 can be a shift register having more than four parallel data outputs and/or additional LED drivers can be incorporated into the system. When more than one receiver 19 is used in the system the receivers are coupled in series and the serial data output is clocked to the series connected receivers prior to being applied microprocessor 17.

The invention having been disclosed, variations within the scope and spirit of the invention will now occur to persons skilled in the art. Whereas the invention is intended to encompass such variations, reference should be made to the appended claims rather than the foregoing discussion of preferred examples, in order to assess the scope of the invention in which exclusive rights are claimed.

I claim:

1. A test apparatus for identifying cabling problems in a system interconnected by a plurality of multiconductor cables providing cabling in a radiating configuration between a main operating unit and a plurality of terminal devices, each coupled separately through respective ones of the cables, the system having at least one port at a terminal connection remote from the main operating unit for each said terminal device in said radiating configuration, the port having a plurality of contacts, the test apparatus comprising:

central control means, coupleable to the cables for each of the terminal devices, the central control means being operable to generate a test signal on certain conductors of the cables coupled to the contacts to selectively test the respective ones of the cables coupling to each said port, and the central control means also including means coupled to the conductors of said port for receiving a response signal from the conductors;

permanently installed shorting means for electrically connecting selected pairs of the plurality of contacts of each said port, said shorting means being engaged with the contacts when the terminal device is not coupled to the port and automatically displaced to disengage from the contacts when the terminal device is coupled to said port, the shorting means establishing characteristic current paths among the contacts such that the test signal output by the central control means produces an expected pattern in the response signal received at the central control means, determined by said shorting means, provided the cabling is free of faults including at least one of short circuits, open circuits and grounded conductors, and an unexpected pattern in the event of such faults, whereby a cabling fault applicable to said port can be determined; and, means coupled to the central control means for indicating a fault when the response signal is not in the expected pattern.

2. A test apparatus for identifying cabling problems in a system interconnected by a plurality of multiconductor cables providing cabling between a main operating unit and a plurality of terminal devices, the system having at least one port at a terminal connection remote from the main operating unit for each said terminal device, the port having a plurality of contacts, the test apparatus comprising:

central control means, coupleable to the cables for each of the terminal devices, the central control means being operable to generate a test signal on certain conductors of the cables coupled to the contacts of each said port, and the Central control means also including means coupled to the conductors of said port for receiving a response signal from the conductors;

permanently installed shorting means for electrically connecting selected pairs of the plurality of contacts of each said port, said shorting means being engaged with the contacts when the terminal device is not coupled to the port and automatically displaced to disengage from the contacts when the terminal device is coupled to said port, the shorting means establishing characteristic current paths among the contacts such that the test signal output by the central control means produces an expected pattern in the response signal received at the central control means, determined by said shorting means, provided the cabling is free of faults including at least one of short circuits, open circuits and grounded conductors, and an unexpected pattern in the event of such faults;

means coupled to the central control means for indicating a fault when the response signal is not in the expected pattern; and, wherein said central control means disengages when said system cabling is coupled to the main operating unit.

3. The test apparatus of claim 2 wherein the means for indicating a fault comprises a plurality of status indicators corresponding to the conductors, for indicating whether a conductor of the cabling is correctly wired to its proper contact.

4. The test apparatus of claim 3 wherein said status indicators comprise a pair of light emitting diodes for each cable, one of the light emitting diodes being illuminated if the response signal is as expected and the other of the light emitting diodes being illuminated if the response signal is unexpected.

5. The test apparatus of claim 1 wherein said central control means includes a microprocessor having memory for storing a plurality of test signal patterns and corresponding expected response signals, the microprocessor being operable to compare the expected response signals to signals received on the conductors.

6. The test apparatus of claim 1, wherein the central control means is permanently installed, for selectively testing said cables between the main operating unit and each of the plurality of terminal devices, and further comprising a patch panel located at said central location, each multiconductor cable of the system cabling terminating at said patch panel, whereby individual cables may be jumped to one another and to selected network ports.

7. The test apparatus of claim 3 wherein said means for indicating a fault is illuminated if a contact of the terminal device is coupled to a respective contact of a respective conductor of said cabling.

8. The test apparatus of claim 7 further comprising switching means operable to disengage the test apparatus from the main operating unit, whereby none of said light emitting diodes illuminate when said system cabling is coupled to the main operating unit.

9. A test apparatus for identifying interconnection faults in a system of multiconductor cabling, the system having a plurality of ports for terminal devices, each port having a plurality of contacts to which conductors of the cabling are coupled in a radiating configuration, individual cables for the respective ports running separately between a central location and locations at which the terminal devices are plugged into the system of multiconductor cabling, the test apparatus comprising:
 a voltage source for providing a voltage on selected outputs coupleable respectively to the conductors of the cabling, to produce drive data words selectively on the individual cables;
 permanently installed means at the locations at which the terminal devices are plugged into the system of multiconductor cabling, operable when a respective terminal device is unplugged to couple certain of the conductors to a testing circuit, whereby the selected outputs are coupled back to said conductors, said permanently installed means being automatically displaced upon plugging the terminal devices into the system of multiconductor cabling to disengage the conductors of the cabling;
 means for reading read data words from the conductors, coupled to an interrogation means, said interrogation means comparing said read data words to expected digital words based on the predetermined pattern; and,
 means for indicating whether or not said read data words agree with said expected digital words.

10. The test apparatus of claim 9 wherein at least one of said voltage source and said means for reading comprises a shift register for holding one of the drive data words and the read data words, the shift register having bits corresponding to each of the conductors.

11. The test apparatus of claim 9 wherein said means for indicating comprises a pair of light emitting diodes, one of the diodes of said pair illuminating if said read data words agrees with the expected digital words, the other illuminating if said read digital words do not agree with the expected digital words.

12. The test apparatus of claim 10 wherein said voltage source further comprises a microprocessor, said microprocessor controlling loading and shifting of said shift register.

13. The test apparatus of claim 12 wherein said interrogation means comprises said microprocessor, and further comprising a memory coupled to the microprocessor for storing a plurality of drive data words and corresponding expected digital words.

14. The test apparatus of claim 9 wherein said at least one port has contacts which are used by the terminal device and contacts which are unused by the terminal device, and further comprising a branching circuit coupled to the contacts, and a shorting bar operable selectively to couple the contacts, thereby coupling the branching circuit to the conductors, the branching circuit at least partly defining the predetermined pattern.

15. The apparatus of claim 9 wherein a plurality of read data words from said plurality of ports are generated, said plurality of read data words being loaded in parallel to a plurality of shift registers, said read data words being serially clocked through said plurality of shift registers to said microprocessor.

16. The test apparatus of claim 9 wherein the test apparatus is substantially permanently installed.

17. A test apparatus for identifying interconnection faults in a network of multiconductor cabling for coupling a plurality of ports for terminal devices to a central location, each port having a plurality of contacts to which conductors of the cabling are coupled, comprising:
 a permanently installed central control means at the central location for generating a test pattern for application to a group of said conductors, and including interrogation means for reading a returned word from said conductors and comparing said returned word to a stored expected word;
 a permanently installed termination on the conductors, remote from the central location, coupling certain of the conductors in a grouping defining the expected word corresponding to the returned word for the test pattern for a correctly wired port, the termination being automatically disengaged from the conductors by connection of a terminal device to a respective said port, and automatically engaged with the conductors upon disconnection of the terminal device; and,
 means for indicating whether or not said read word agrees with said stored expected work.

18. The test apparatus of claim 17 further comprising:
 at least one shorting bar for electrically coupling certain of said conductors at said at least one port; and,
 at least one branching circuit having current blocking means, said branching circuit further coupling conductors at said at least one point, said at least one shorting bar and said at least one branching circuit defining a relationship between said test pattern and said returned word.

19. The test apparatus of claim 17 further comprising a microprocessor for generating said test pattern, reading said returned word, and having memory for storing said expected word.

20. The test apparatus of claim 17 wherein said central control means further comprises at least one shift register for either of generating said test pattern or receiving said returned word.

* * * * *

UNITED STATES PATENT AND TRADEMARK OFFICE
CERTIFICATE OF CORRECTION

PATENT NO. :     5,414,343
DATED      :     May 9, 1995
INVENTOR(S) :    Flaherty et al.

It is certified that error appears in the above-indentified patent and that said Letters Patent is hereby corrected as shown below:

Column 7, line 17, delete the word "if" and insert therefor --in--.

Column 7, line 30, delete the word "of" and insert therefor --or--.

Column 7, line 52, delete the work "note" and insert therefor --noted--.

Column 10, claim 2, line 18, delete "Central" and insert therefor --central--.

Column 12, claim 17, line 42, delete the word "work" and insert therefor the word --word--.

Signed and Sealed this

Twenty-first Day of November, 1995

*Attest:*

BRUCE LEHMAN

*Attesting Officer*    *Commissioner of Patents and Trademarks*